US006483134B1

(12) United States Patent
Weatherford et al.

(10) Patent No.: US 6,483,134 B1
(45) Date of Patent: Nov. 19, 2002

(54) INTEGRATED CIRCUITS WITH IMMUNITY TO SINGLE EVENT EFFECTS

(75) Inventors: Todd R. Weatherford, Pence Spring, WV (US); Dale P. McMorrow, Chantilly, VA (US); Walter R. Curtice, Princeton Junction, NJ (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 08/656,494

(22) Filed: May 31, 1996

(51) Int. Cl.[7] ..................... H01L 29/812; H01L 29/207
(52) U.S. Cl. ..................... 257/280; 257/192; 257/609
(58) Field of Search ................................ 257/192, 195, 257/280, 282–4

(56) References Cited

U.S. PATENT DOCUMENTS

| | | | |
|---|---|---|---|
| 4,887,236 A | 12/1989 | Schloemann | 365/173 |
| 4,952,527 A | * 8/1990 | Calawa et al. | 257/349 |
| 4,979,003 A | * 12/1990 | Wennekers | 257/192 |
| 5,081,062 A | 1/1992 | Vasudev et al. | 437/132 |
| 5,332,918 A | 7/1994 | Smith et al. | 257/431 |
| 5,411,914 A | * 5/1995 | Chen et al. | 257/284 |
| 5,594,262 A | * 1/1997 | Lee et al. | 257/192 |

OTHER PUBLICATIONS

Marshall Et Al "Heavy Ion SEU Immunity of a GAAs Complementary HIGFET Circuit Fabricated on a Low Temperature Grown Buffer Layer" IEEE Trans. Nuclear Science, vol. 42 (12/95) pp. 1850–1855, Dec. 1995.*

Weatherford Et Al "Significant Reduction in the Soft Error Susceptibility of GAAs Field–Effect Transistors with a Low–Temperature Grown GAAs Buffer Layer" Applied Pays. Lett., vol. 67 (7/95) pp. 703–705, Jul. 1995.*

McMorrow Et Al "Elimination of Charge–Enhancement Effects in GAAs FETs with A Low–Temperature Grown GAAs Buffer Layer" IEEE Trans. Nuclear Science, vol. 42 (12/95) pp. 1837–1843, Dec. 1995.*

* cited by examiner

Primary Examiner—Gene M. Munson
(74) Attorney, Agent, or Firm—John J. Karasek; Lawrence G. Legg

(57) ABSTRACT

The present invention is an electronic structure having a buffer layer with a short average carrier lifetime, at least about 1000 Å thick with an upper face, and an integrated circuit disposed over the upper face of the buffer layer, where this integrated circuit would otherwise be susceptible to soft errors, due to its configuration, its clock speed, its use environment, or a combination of these factors. In a preferred embodiment, the preferably high recombination rate buffer layer is an LT GaAs or GaAs:Er buffer layer.

1 Claim, 4 Drawing Sheets

INTEGRATED CIRCUITS WITH IMMUNITY TO SINGLE EVENT EFFECTS

BACKGROUND OF THE INVENTION

1. Field of the Invention

The present invention relates to mitigating or eliminating single event effects in integrated circuits that would otherwise be susceptible to single event effects. More particularly, the present invention relates to decreasing the free carrier lifetime of electrons and holes that would otherwise contribute to single event effects, through the use of a buffer layer.

2. Description of the Related Art

Three major types of radiation-induced effects are generally recognized as potential interferents with integrated circuits: total dose effects, transient effects, and soft errors (a.k.a. single event effects). Some other effects, e.g. neutron damage, are recognized by some practitioners.

Total dose effects are related to the permanent failure of an entire integrated circuit caused by an accumulation of radiation, e.g., x- or γ-rays. Such exposure can cause permanent threshold voltage shifts in integrated circuits that are not hardened against total dose radiation. As the name suggests, total dose radiation effects are related to the entire exposure history of integrated circuits—when the total dose exceeds some threshold value, circuit failure is observed. GaAs technology is inherently less susceptible to total dose effects than other technologies.

Transient effects are likewise caused by the exposure of an entire integrated circuit to a flood of radiation, typically x- or γ-rays. However, these are typically related to a short burst (10–20 ns) of high intensity radiation, such as that emitted by a nuclear detonation. Such exposure can cause temporary, and in some case permanent, failure in integrated circuits that are not hardened against transient effect radiation.

Single event effects are a distinct phenomenon from total dose and transient effects. See generally Sherra E. Kerns, *Transient-Ionization and Single-Event Phenomena,* in Ionizing Radiation Effects in MOS Devices and Circuits 485–91 (John Wiley & Sons, Inc., T. P. Ma et al. eds., 1989). Unlike total dose effects and transient effects, single event effects are localized to a particular region of an integrated circuit. Single event effects occur when a particle (such as a cosmic ray, proton, or neutron) changes the state of a particular device in an integrated circuit, thereby causing an error.

Single event effects that take place in memory chips are referred to as single event upsets. These occur when an element in a memory chip has its state changed (i.e., from a 1 to a 0 or from a 0 to a 1) by the action of a high energy particle interacting with the chip. In memory chips, the frequency of single event upsets will depend principally on the use environment and on the configuration of the memory chip. Single event effects also will occur in other logic chips, e.g., microprocessors. In these chips, the frequency of single event effects will depend on the clock speed of the device, as well as on the use environment and configuration of the device. This clock speed dependence arises from the fact that at higher clock speeds, the fraction of time that a particular logic gate spends in transition from one state to another increases. Edge-triggered devices are susceptible to soft errors in the transition region. Consequently, the larger fraction of time high-speed devices spend in the transition region increases the window of susceptibility to soft errors. The technological trend for the past several years has been toward edge-triggered circuits and away from comparative level-triggered circuits.

A number of factors can contribute to the frequency of single event effects in a device. The factor that has been most well documented to date is the use environment of the device. Electronic devices used in outer space, for instance, are bombarded with cosmic rays and protons that will induce soft errors in unhardened ICs. To date, the only effective methods for hardening these circuits against cosmic rays and protons have been shielding, redundancy, and error detection and correction (EDAC).

Likewise, neutrons, alpha particles, and other high energy particles will induce single event effects in devices that are used in environments that have high concentrations of these particles. It would be desirable, for example, to operate satellites within the Van Allen belts. However, this is currently impossible without the use of shielding, redundancy, and/or EDAC, due to the high particle concentrations within the Van Allen belts.

Even at elevations within the atmosphere, e.g. at elevations of 20,000 to 50,000 feet, single event effects can create electronic errors. It has been established that single event effects can interfere with airborne electronics.

Even at sea level, the concentration of single event-inducing particles is nonzero. To date, this has not been a major concern because single event effects are uncommon at sea level. This is due to the still relatively slow clock speeds and large device sizes in the digital electronics in use today. However, high-speed supercomputers and other cutting edge technologies may already be experiencing some errors that may be associated with single events. As typical clock speeds increase, past 250 MHz, to 500 MHz, 1 GHz, 2 GHz, and beyond, the occurrence of single event effects will increase proportionately. Aggravating this increase in clock speeds is the decreasing size of the transistors in ICs. A smaller device generally has a smaller capacitance, and accordingly will require a smaller charge to cause the device to change its state. Thus, it can be predicted that, for example, a GaAs IC (FET technology) with a clock speed of 1 GHz, with a device density of $10^6$ transistors, will have an unacceptably high error rate, on the order of about 1–10 errors/day at sea level under normal conditions or about 10–1000 errors/day at sea level during solar events.

It is also desired to improve the isolation of devices in ICs, reducing leakage currents.

Calawa et al., U.S. Pat. No. 4,952,527, teaches the use of 2.0 μm buffer layers of low-temperature grown GaAs under III-V semiconductor microwave devices, to improve their back-gating effects and their resistivity, and also to improve their hardness against transient radiation.

SUMMARY OF THE INVENTION

Accordingly, it is an object of this invention to provide digital ICs that have improved resistance to single event effects, by several orders of magnitude.

It is a further object of this invention to provide such resistance without the need for additional shielding or redundancy.

It is a further object of this invention to provide such resistance in ICs that are of at least MSI, LSI, or VLSI complexity.

It is a further object of this invention to provide such resistance in ICs that have high clock speeds.

It is a further object of this invention to provide improved isolation of devices in ICs.

These and additional objects of the invention are accomplished by the structures and processes hereinafter described.

The present invention is an electronic device having a buffer layer characterized by short carrier lifetimes within the buffer layer, this buffer layer being at least about 1000 Å thick and having an upper face, and an integrated circuit disposed over the upper face of the buffer layer, where this integrated circuit would otherwise be susceptible to soft errors, due to its configuration, its clock speed, its use environment, or a combination of these factors. As used herein, "over", "under", "upper", "lower" and the like are used as relative terms for convenience only, and do not require or imply any particular orientation with respect to gravitational fields.

BRIEF DESCRIPTION OF THE DRAWINGS

A more complete appreciation of the invention will be obtained readily by reference to the following Description of the Preferred Embodiments and the accompanying drawings in which like numerals in different figures represent the same structures or elements, wherein.

DETAILED DESCRIPTION OF THE PREFERRED EMBODIMENTS

T. R. Weatherford et al., "Significant reduction in the soft error susceptibility of GaAs field-effect transistors with a low-temperature grown GaAs buffer layer", *Appl. Phys. Lett.* 67(5) 703–05 (Jul. 31, 1995), is incorporated by reference herein, in its entirety, for all purposes.

P. W. Marshall et al., "Heavy Ion SEU Immunity of a GaAs Complementary HIGFET Circuit Fabricated on a Low Temperature Grown Buffer Layer", *IEEE Transactions on Nuclear Sci.* 42(6) 1850–55 (December 1995), is incorporated by reference herein, in its entirety, for all purposes.

D. McMorrow et al., "Elimination of Charge-Enhancement Effects in GaAs FETs with a Low-Temperature Grown GaAs Buffer Layer", *IEEE Transactions on Nuclear Sci.* 42(6) 1837–43 (December 1995), is incorporated by reference herein, in its entirety, for all purposes.

Single event upsets are governed by the relationship:

$$Q=cV \tag{1}$$

where Q is charge that interacts with the IC, c is capacitance, and V is voltage. For a device with capacitance c and a threshold voltage of V (the voltage difference between the 0 state and the 1 state), a charge buildup Q will cause the device to change states. If some or all of this Q comes from incident high-energy particles, soft errors can be the result.

Figure 1:
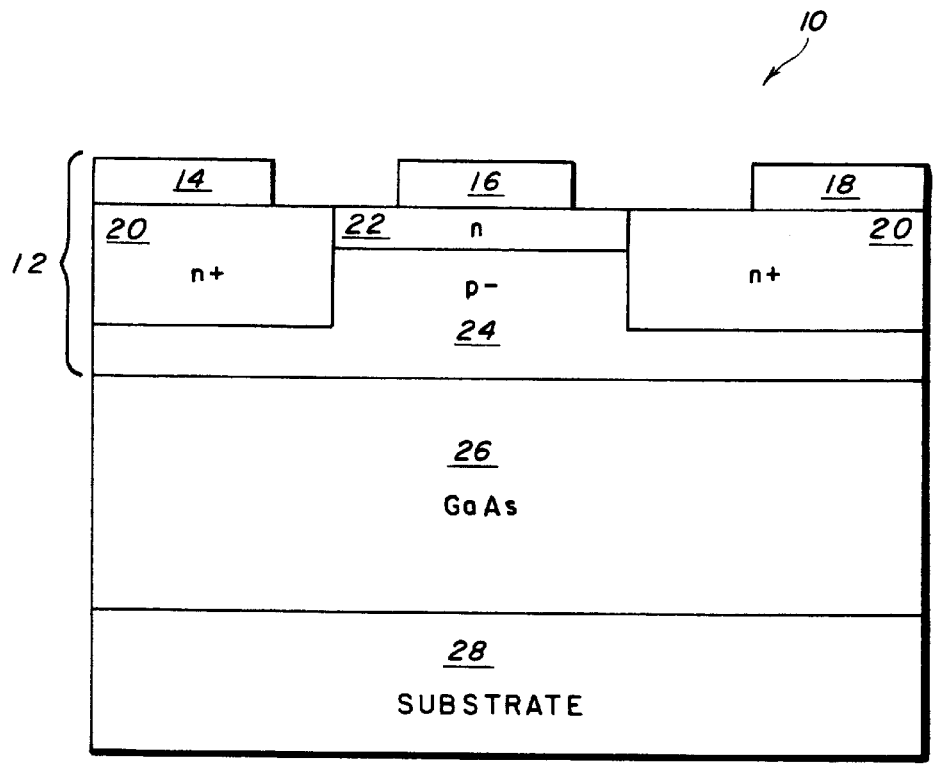
FIG. 1 shows the cross-section of a device of the prior art.

Referring to FIG. 1, the device 10 shown is a typical electronic structure that will be referred to for illustration purposes. In this device, a transistor 12, comprising a source 14, gate 16, drain 18, two n+-doped regions 20, an n-doped region 22, and a p$^-$-doped region 24, is disposed over a GaAs semi-insulating layer 26 and a substrate 28. As shown by the arrow, a high-energy particle will penetrate into this GaAs layer, and will interact with this layer to produce a high density of electron-hole pairs. Carriers produced by this interaction will be able to migrate towards the transistor in the structure, where they may cause soft errors in the structure. Charge collected at the transistor terminals will corrupt data in the IC, initiating soft errors in the logic.

Figure 2:
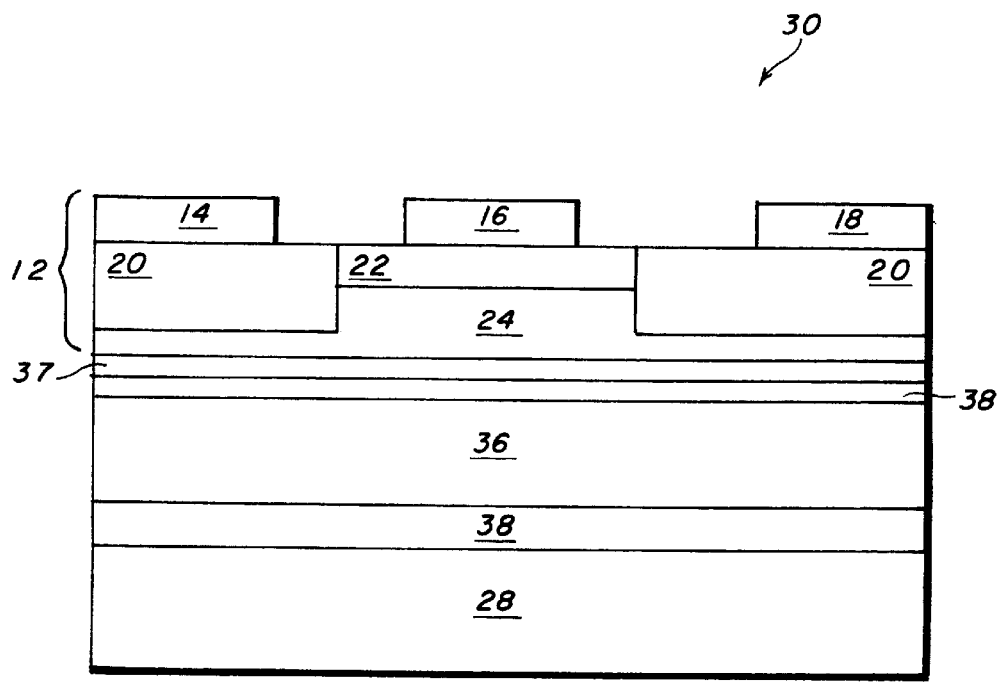
FIG. 2 shows the cross-section of an exemplary device according to the present invention.

In contrast, FIG. 2 shows an exemplary device 30 according to the present invention. In this device 30, a transistor 12, comprising a source 14, gate 16, drain 18, two n$^+$-doped regions 20, an n-doped region 22, and a p$^-$-doped region 24, is disposed over a buffer layer having a short average carrier lifetime 36, and a substrate 28. An optional diffusion barrier 38 may be disposed between the transistor 12 and the buffer layer 36, and between the buffer layer 36 and the substrate 28. Optionally, one or more secondary buffer layers 37 may be disposed between the buffer layer 36 and the transistor 12, to facilitate growth.

The buffer layers 36 used in the structures of the invention will have average carrier lifetimes of less than 100 picoseconds. Preferably, these buffer layers 36 will have average carrier lifetimes of less than about 50 ps. More preferably, these buffer layers 36 will have average carrier lifetimes of less than about 10 ps. Even more preferably, these buffer layers 36 will have average carrier lifetimes of less than about 1 ps. Most preferably, these buffer layers 36 will have average carrier lifetimes of less than about 500 femtoseconds.

As shown by the arrow, a high-energy particle will penetrate into this buffer layer, and will interact with this layer to produce conduction band electron-hole pairs. However, if the thickness and carrier lifetime of this buffer layer are chosen appropriately, carriers will tend to recombine before soft errors occur. Buffer layers according to the invention may intrinsically possess short carrier lifetimes (i.e., in their as-grown-and-annealed state), or may be modified to increase the density of recombination centers (to shorten carrier lifetimes), e.g., through radiation damage or through ion implantation.

Buffer layer materials with intrinsically short carrier lifetimes are highly preferred. Such materials include low-temperature grown gallium arsenide (LT GaAs) and erbium-doped gallium arsenide (GaAs:Er).

In the case of LT GaAs, there is a relationship between the growth temperature, the annealing conditions, and the carrier lifetime. Higher growth temperatures correspond to slower recombination rates and longer carrier lifetimes. Thus, a GaAs layer grown at about 200° C. may have an average carrier lifetime of less than 1.0 ps, a GaAs layer grown at about 300° C. may have an average carrier lifetime of about 10 ps, and a GaAs layer grown at about 400° C. may have an average carrier lifetime of about 50 ps (assuming in each case annealing after growth).

Skilled practitioners will recognize that adjusting annealing conditions may be needed to optimize device performance and SEU hardness. Annealing low-temperature-grown GaAs made with excess As will cause this excess As to precipitate out. Without wishing to be bound by theory, it is suggested that these As precipitates may form recombination centers in the buffer layer. Without wishing to be bound by theory, it is further suggested that precipitating excess As will retard the diffusion of excess As into the IC, where this As could degrade IC performance. Typical annealing temperatures are between about 600° C. and about 900° C. Typical annealing times are between about 1 minute and about 30 minutes. Skilled practitioners will recognize that at higher temperatures, shorter annealing times may be used, and at lower temperatures, longer annealing times may be used.

To compensate for undesirably long carrier lifetimes, thicker buffer layers preferably will be employed. For example, buffer layers according to the invention may be grown at temperatures typically below 600° C., more typically below 400° C., preferably below 350° C., more preferably between about 150° C. and about 300° C., and most preferably between about 190° C. and about 250° C. Likewise, the buffer layer preferably will be sufficiently thick to prevent single event effects. Depending upon the carrier lifetime in the buffer layer, the buffer layer may be between about 0.1 and 25 $\mu$m thick, between about 0.5 and about 10 $\mu$m thick, between about 0.5 and 5 $\mu$m thick, or between about 0.5 and 1.5 $\mu$m thick. Most preferably, the buffer layer is as thin as possible to achieve the desired result, e.g., between about 0.5 and 1.0 $\mu$m thick.

With respect to GaAs:Er buffer layers, it has been found that higher Er content is associated with faster recombination in at least the Er concentration range of $10^{17}/cm^3$ to $10^{20}/cm^3$. See S. Sethi et al., "Backgating in Pseudomorphic $In_{0.15}Ga_{0.85}As/Al_{0.25}Ga_{0.75}$ MODFET's with a GaAs:Er Buffer Layer", *IEEE Electron Device Lett.* 16(12) 537–39 (December 1995), which is incorporated by reference herein, in its entirety, for all purposes.

Materials such as GaAs:Er and LT GaAs having inherently high recombination rates can provide buffer layers that improve the radiation hardness of ICs by multiple orders of magnitude.

Radiation-damaged (including neutron-damaged) buffer layers may also be used. However, this approach may not provide the same level of SEU hardness as optimized LT GaAs.

Ion-implanted buffer layers may also be used. However, this approach may not provide the same level of SEU hardness as optimized LT GaAs. Furthermore, they will tend to require more processing than the as-grown materials.

Skilled practitioners will recognize that one way of achieving short carrier lifetimes, perhaps the most direct way, is to have high recombination rates in the buffer layer. Preferably, a buffer layer according to the present invention will have a recombination rate that is sufficiently high to achieve the desirable short carrier lifetimes. However, skilled practitioners will recognize that other factors may influence the average carrier lifetime, typically to shorten this lifetime. Carrier trapping is an example of a phenomenon that will tend to shorten carrier lifetimes in buffer layers.

In a preferred embodiment of the invention, a diffusion barrier layer is interposed between the buffer layer and the IC. This diffusion barrier layer will help protect the properties of both the IC and the buffer layer over time. Suitable diffusion barrier layer materials include AlAs and AlGaAs. Various Al/Ga ratios may be used in AlGaAs diffusion barrier layers, e.g., $Al_{0.5}Ga_{0.5}As$, $Al_{0.25}Ga_{0.75}As$, and $Al_{0.75}Ga_{0.25}As$. Such a diffusion barrier layer may be quite thin, on the order of 50–500 Å, typically about 100 Å.

Preferably, the diffusion barrier layer is not thicker than necessary to prevent diffusion (especially arsenic diffusion) between the IC and the buffer layer.

An optional secondary buffer layer will be used to facilitate growth between layers that do not grow well directly upon each other. The thickness of the secondary buffer layer 37 will be limited to the level of SEU hardness desired for devices having a particular gate length and clock speed. A thinner secondary buffer layer 37 will keep buffer layer 36 closer to the transistor. The closer buffer layer 36 is to the transistor 12, the more SEU hardness is provided (skilled practitioners will recognize that there are trade-offs to this arrangement). E.g., for a device with a 5 GHz clock rate and a 1.0 $\mu$m gate length, soft errors may result if the buffer layer 36 is more than 0.5 $\mu$m from the transistor.

The structures of the invention include structures having complex ICs (MSI complexity or higher, including LSI or VLSI complexity). It has been found that problems with single event effects will be observed frequently enough to pose a serious problem in circuits with 10,000 or more transistors.

The structures of the invention also include structures having circuits that may be less complex, but are disposed in use environments that are especially hostile, i.e., environments where the concentration of particles that are capable of inducing soft errors is higher than the concentration of such particles at earth's surface.

The structures of the invention require that the IC can be disposed over the buffer layer. For ICs made from semiconductors in the III-V family grown over LT GaAs or GaAs:Er buffers, this is straightforward. GaAs and InGaAs ICs have been demonstrated with LT GaAs buffers. Furthermore, as growth technology improves, the ability to deposit one layer over another will likewise improve, even between layers with poor lattice matching. Skilled practitioners will recognize that a great deal of research has been done, and continues to be done, to develop techniques for semiconductor growth. For example, some success has been achieved growing GaAs over Si.

The structures of the invention may be made using conventional deposition techniques, such as molecular beam epitaxy (MBE) or organo-metallic chemical vapor deposition (OMCVD). It is particularly important to keep good quality, clean interfaces between layers. Accordingly, the buffer layer should be thoroughly cleaned before additional processing.

Having described the invention, the following examples are given to illustrate specific applications of the invention, including the best mode now known to perform the invention. These specific examples are not intended to limit the scope of the invention described in this application.

EXAMPLE 1

Demonstration of the Invention by Computer Simulation

Figure 3:
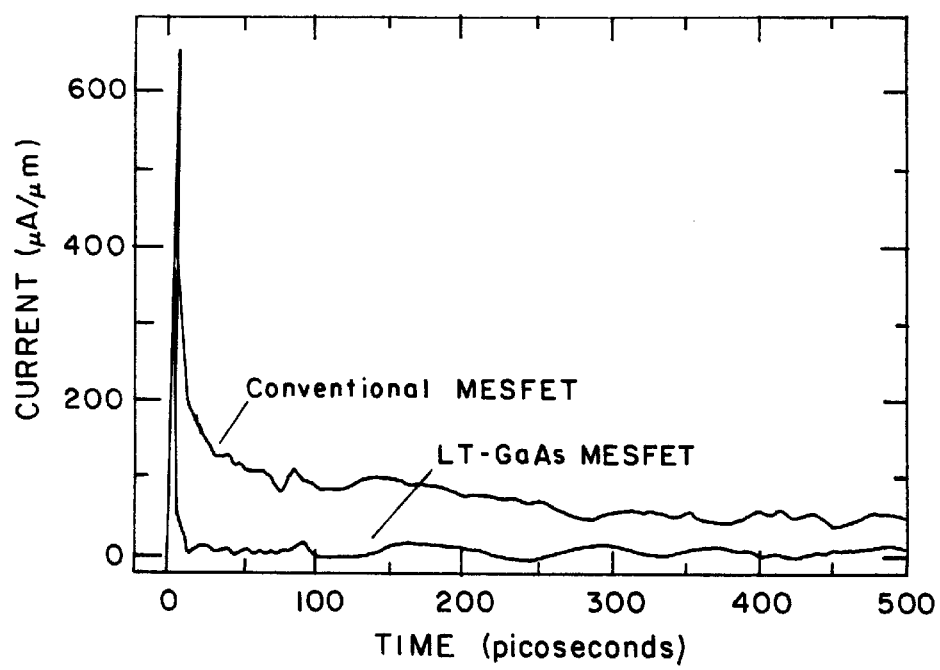
FIG. 3 shows the computer simulation results of charge collection transients on a drain electrode for both a conventional device and a device according to the present invention.

The operation of two 0.8 $\mu$m gate length enhancement mode MESFETs was modelled: one simulated MESFET was disposed over a 3.86 $\mu$m LT GaAs buffer layer, and one simulated MESFET was disposed over a 3.86 $\mu$m conventional GaAs layer. Additional experimental details are given in T. R. Weatherford et al., supra. FIG. 3 shows the charge collection transients on the drain electrode for both the conventional device and the device with the LT GaAs buffer layer, where these devices were simulated to be biased near their normal operating points of $V_G$=0V, $V_D$=2V, and $V_S$=0V. It can be seen that the device with the LT GaAs buffer layer returns to its baseline state within 10 ps, while the conventional device does not return to is baseline state at all for the duration of the simulated experiment (500 ps). The collected charge was reduced accordingly.

EXAMPLE 2

Demonstration of the Invention by Physical Experiments

Figure 4:
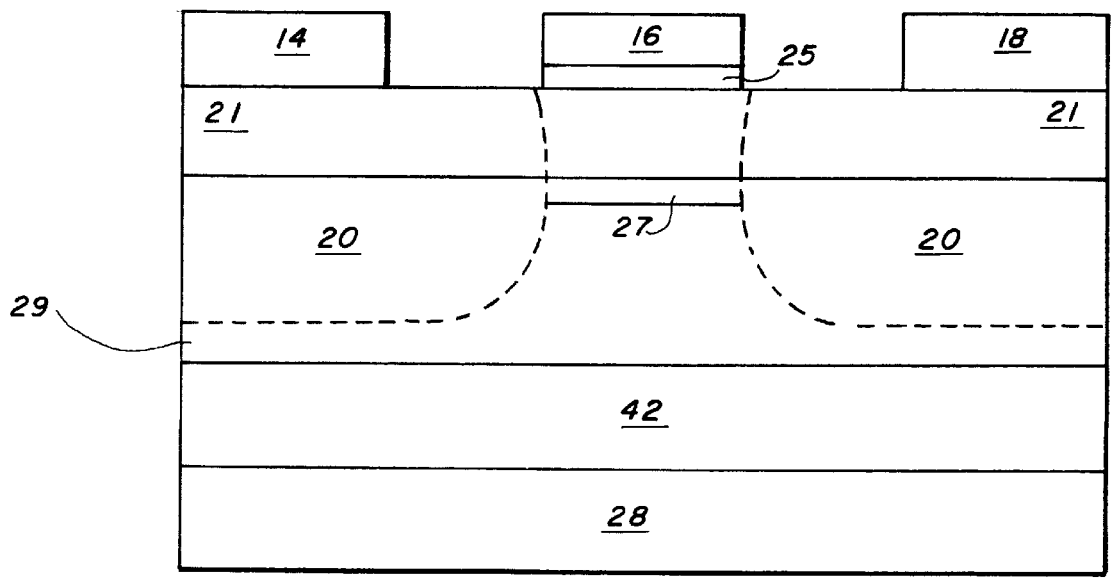
FIG. 4. shows the cross-section of a test device.

Charge collection experiments have been performed on n-channel heterojunction insulated-gate FETs (HIGFETs) both with and without an LT GaAs buffer layer. The test device is shown in FIG. 4. In the test device 40, a layer 42 that was either conventional GaAs or LT GaAs (depending on the experiment) was grown over GaAs substrate 28. Grown over this layer was a GaAs layer 29, and over the GaAs layer was an AlGaAs layer 21. Patterned onto the AlGaAs layer were a source 14, a gate 16, and a drain 18. Interposed between the gate 16 and the AlGaAs layer 21 was a Schottkey barrier 25. Two doped regions 20 were formed in the AlGaAs and GaAs layers, 29,42, as indicated by the dashed lines. The interaction of these layers formed a quantum well 27.

Ion- and laser-induced charge collection experiments were performed with the NRL ion microbeam facility and the ultrafast laser facility, as described in McMorrow et al., supra, and references cited therein. Laser pulses were used to simulate cosmic ray bombardment. The use of these pulses has the advantage of not damaging the transistor. However, the disadvantage is that the laser pulses do not induce charge in the structure as uniformly as an ion or a cosmic ray will, since laser pulses are attenuated as they travel through the structure.

Figure 5:
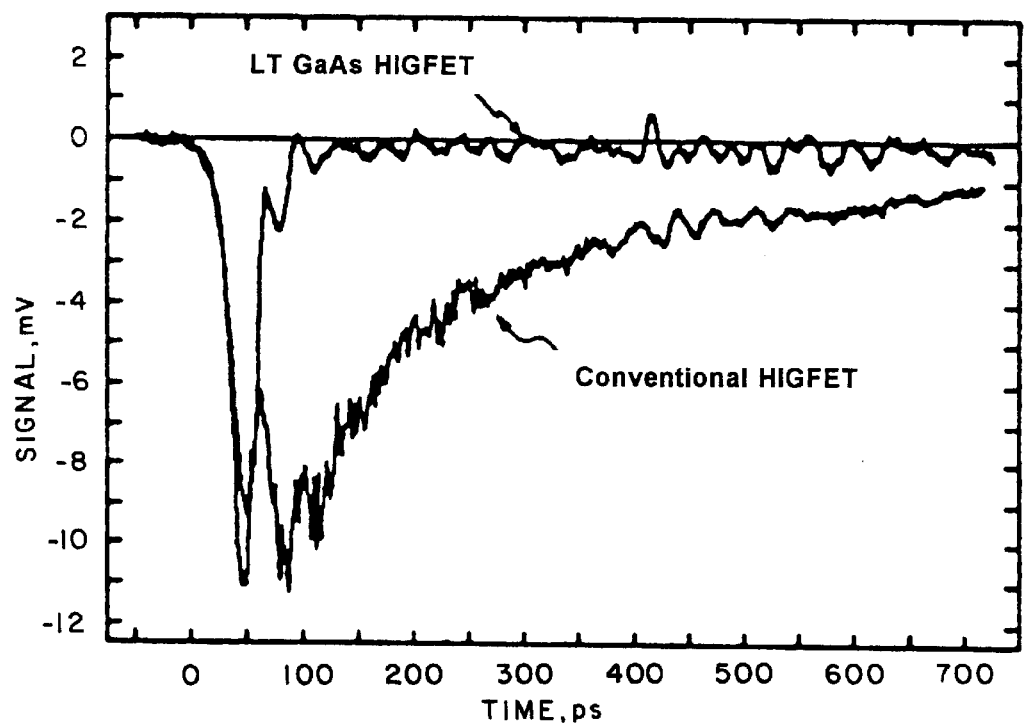
FIG. 5 shows the laser-induced charge collection transients measured for conventional and LT GaAs HIGFETs.

FIG. 5 shows the laser-induced charge collection transients measured for conventional and LT GaAs HIGFETs for excitation with 180 fJ laser pulses centered at 600 nm (into a 50Ω load). One sees that the LT GaAs layer provided a dramatic improvement in the laser-induced charge collection transients, compared to the conventional HIGFET.

Figure 6:
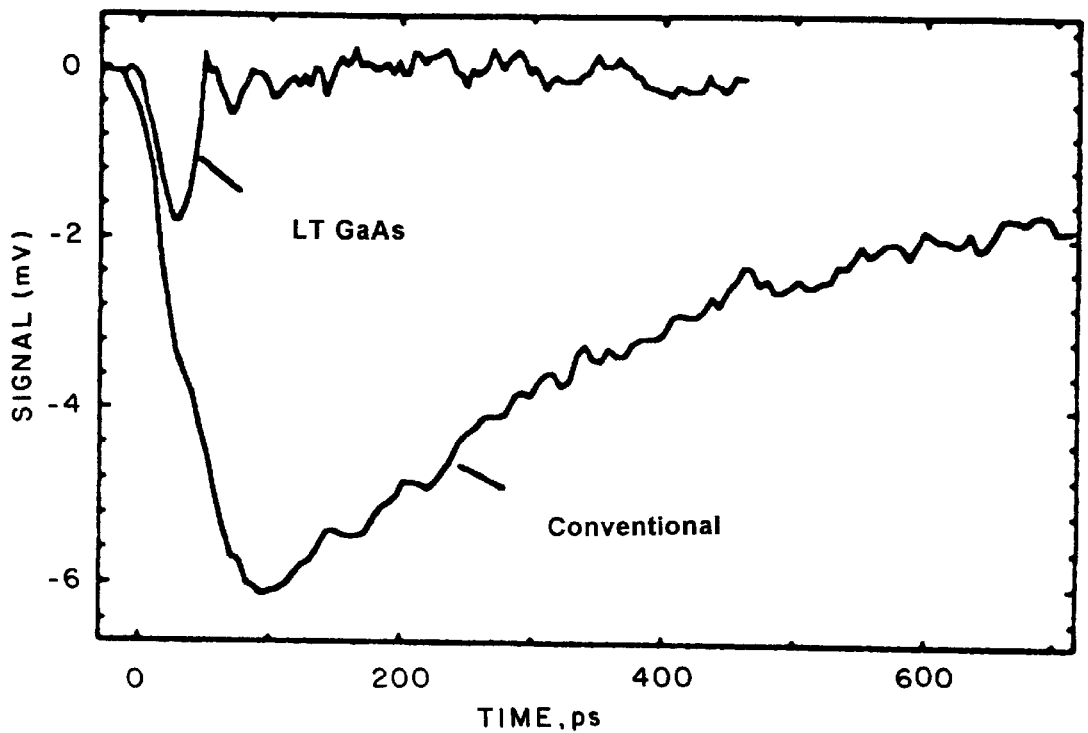
FIG. 6 shows the 3 MeV ion-induced charge collection transients measured for n-channel conventional and LT GaAs HIGFETs.

FIG. 6 shows the 3 MeV α-particle induced charge collection transients measured for n-channel conventional and LT GaAs HIGFETs. $V_G$=0.2V, $V_D$=1.5V, and $V_S$=0V. One sees that the LT GaAs layer provided about a 100-fold reduction in charge collection, compared to the conventional HIGFET. Error rates approximately follow the square of the charge collection.

Figure 7:
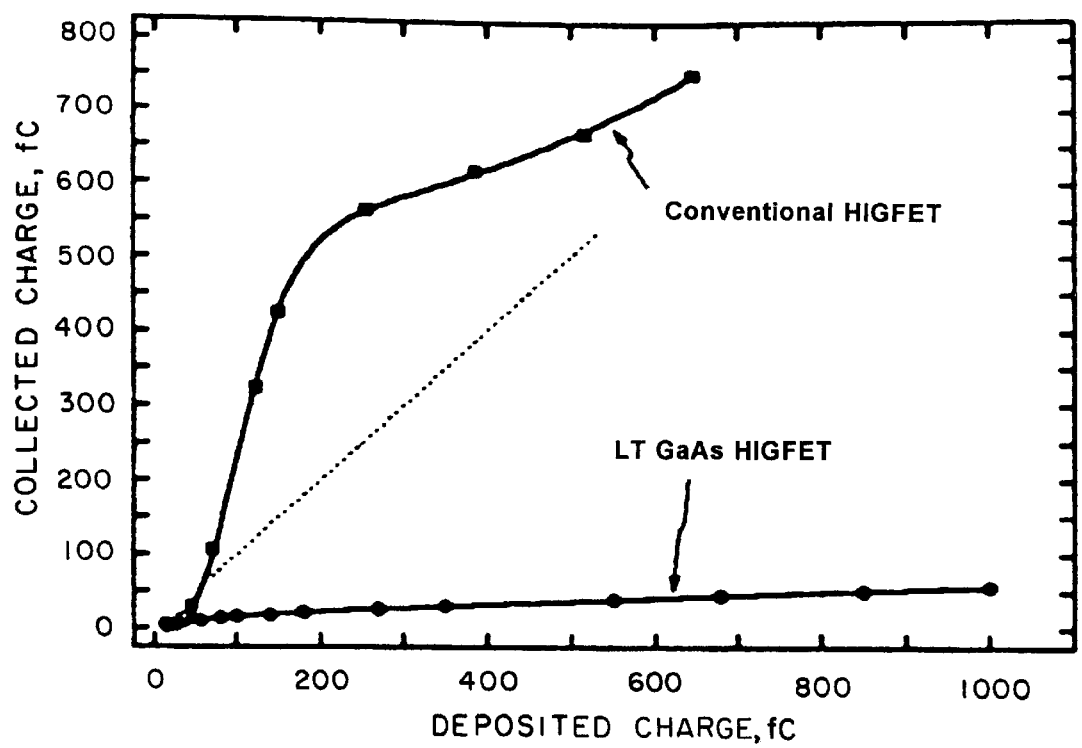
FIG. 7 shows the time-integrated drain charge collection measurements for conventional and LT GaAs HIGFETs as a function of the laser pulse energy.

FIG. 7 shows the time-integrated drain charge collection measurements for conventional and LT GaAs HIGFETs as a function of the laser pulse energy. $V_G$=−0.1V, $V_D$=2V, and $V_S$=0V. One sees that the LT GaAs layer limited the charge collection substantially.

EXAMPLE 3

Demonstration of the Invention by Physical Experiments

Dynamic SEU characteristics of GaAs complementary HIGFET devices fabricated on conventional semi-insulating substrates were compared to the dynamic SEU characteristics of devices fabricated on LT grown GaAs substrates. Experimental details may be found in Marshall et al., supra. Heavy ion test results on shift register and flip-flop devices from the same process lot demonstrated that the LT GaAs layer provides immunity from upsets, even at an LET value of 90 MeV cm$^2$/mg. This result is also consistent with pulsed laser measurements performed on the same flip-flop circuits used in the ion test.

Obviously, many modifications and variations of the present invention are possible in light of the above teachings. It is therefore to be understood that, within the scope of the appended claims, the invention may be practiced otherwise than as specifically described.

What is claimed is:

1. An electronic device that is resistant to single event upsets, comprising:
   a buffer layer having an average free carrier lifetime on the order of 100 picoseconds or less, said layer being at least about 1000 Å thick, and having an upper face; and
   an integrated circuit of at least medium scale integration, disposed over said upper face of said buffer layer;
   wherein said buffer layer consists essentially of erbium-doped GaAs.

* * * * *